United States Patent [19]

Gay

[11] 3,937,885
[45] Feb. 10, 1976

[54] CONTROL CIRCUIT FOR A MATRIXED FOUR CHANNEL AUDIO REPRODUCING SYSTEM

[75] Inventor: Michael J. Gay, Geneva, Switzerland

[73] Assignee: Motorola, Inc., Chicago, Ill.

[22] Filed: Sept. 6, 1974

[21] Appl. No.: 503,833

[52] U.S. Cl............................................ 179/1 GQ
[51] Int. Cl............................................. H04r 5/00
[58] Field of Search................ 179/1 GQ, 100.4 ST, 179/100.1 TD, 1 G, 1 VL, 1 D; 330/29, 30 D, 144

[56] References Cited
UNITED STATES PATENTS

| | | | |
|---|---|---|---|
| 3,451,006 | 6/1969 | Angaard, Jr. | 330/30 D |
| 3,473,139 | 10/1969 | Legler | 330/30 D |
| 3,725,583 | 4/1973 | Gunderson et al. | 179/1 VL |
| 3,794,781 | 2/1974 | Bauer | 179/1 GQ |
| 3,798,373 | 3/1974 | Bauer | 179/100.4 ST |
| 3,821,471 | 6/1974 | Bauer | 179/100.4 ST |
| 3,825,684 | 7/1974 | Ito et al. | 179/1 GQ |

Primary Examiner—William C. Cooper
Assistant Examiner—Thomas D'Amico
Attorney, Agent, or Firm—Harry M. Weiss; Maurice J. Jones, Jr.

[57] ABSTRACT

A gain controlled audio amplifier for each channel which includes a differential to single ended converter fed by a differential amplifier, the common emitters of which are coupled to balance and volume control circuitry for controlling the amount of current flowing in the amplifier relative to the other three amplifiers. A pair of diodes are connected in back-to-back relationship between the control electrodes of the differential amplifier and receive a signal from an enhancement circuit which controls the amount of signal being applied to the input of the differential amplifier. The enhancement circuit includes a pair of amplifier sections which are connected together so that the output voltage of one increases as the other decreases and vice versa and the decrease of output voltage in either section occurs substantially more rapidly than the increase of output voltage in the other section. The balance and volume control circuitry controls the total amount of current flowing into the four amplifiers, the amount of the total current flowing into either of two pairs of the amplifiers relative to the other pair of amplifiers and the amount of the total current flowing into each of the amplifiers in the two pairs relative to the other amplifier in the pairs.

14 Claims, 4 Drawing Figures

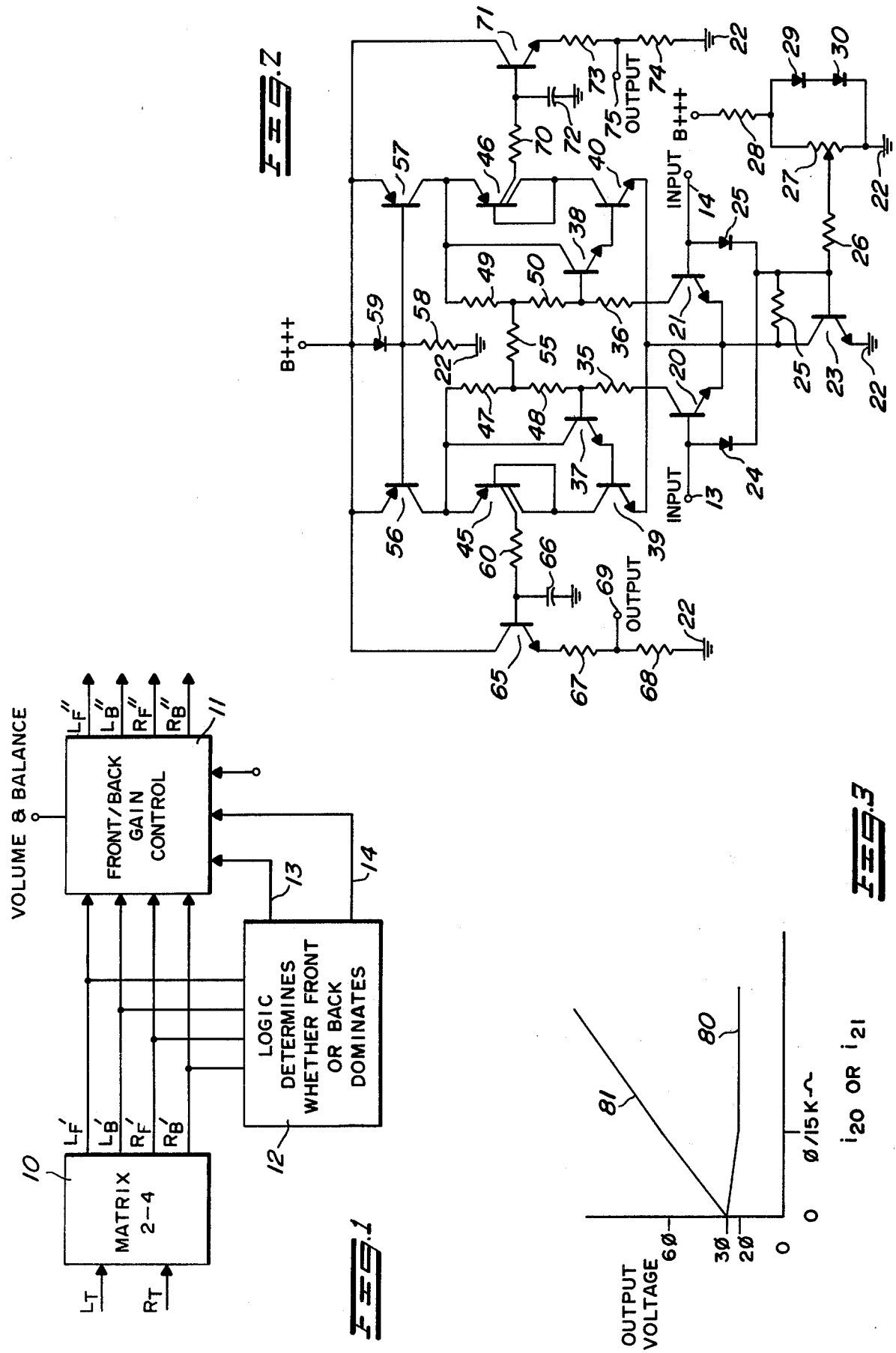

CONTROL CIRCUIT FOR A MATRIXED FOUR CHANNEL AUDIO REPRODUCING SYSTEM

BACKGROUND OF THE INVENTION

In matrixed four channel audio systems, two channels of sound are obtained from a phonograph record or the like. The two channels of sound are generally referred to as left and right channels and are converted by an electronic matrix to left front, left back, right front and right back channels. The content of the four channels derived from the two signal channels depends on the method of matrixing chosen. In any case it is not possible to recover the four separate audio channels which were encoded as two channels for the purpose of transmission or permanent record in a primarily two channel system. Some of the four channel effect can be recovered if the four audio signals are matrixed from four to two channels in the record or transmission process and by complementary de-matrix recovered in the receiving process. It is inherent that associated with the matrixing technique incomplete separation occurs and cross talk between the four recovered channels is present at the output of the matrix. The type of cross talk that occurs can be chosen by adjustment of the encode and decode matrix.

In the system to which the invention is directed the matrixes are chosen to provide good separation between the audio signals representing left and right portions of the sound field, but limited separation between the audio signals representing front and back, this method of matrixing has been devised by the CBS Corporation and has been given the name SQ (registered trademark) by its innovators.

This invention is directed toward improving the front to back separation in a matrixed audio sound field of the SQ type. To improve the apparent separation of the front and back speakers a system has been devised whereby logic circuitry is connected to the four channels at the output of the matrix to determine which of the two pairs of channels (left front - right front or left back - right back) has the dominant signal thereon. The logic circuitry then uses this information to produce a pair of signals which control the gain of four amplifiers, one in each channel. The gain of the amplifiers is controlled so that the total volume remains constant but the volume of the front speakers is increased and the back speakers is decreased when the left front and/or right front channels have dominating signals therein and the opposite occurs when the left back and/or right back channels have dominating signals therein.

SUMMARY OF THE INVENTION

The present invention pertains to a control circuit for use in an audio reproducing system having a plurality of speakers driven by signals from four channels, which signals are derived from a two channel input, and which system includes logic circuitry for separating the four channels into two pairs of channels and determining which signals in the two pairs of channels are dominant and providing output signals thereof. The control circuit includes four amplifiers, for the four channels, each of which includes a differential amplifier connected to a differential to single ended converter providing very low distortion even at relatively high currents and further providing essentially a voltage signal at the output. Balance and volume control circuitry has four outputs connected to the differential amplifiers of the four audio amplifiers and operates as a constant current source therefor. The balance and volume control circuitry includes a first differential amplifier having common emitters connected to ground through a transistor which carries the total current for all four audio amplifiers and has a manual volume control connected to the base thereof. The two collectors of the differential amplifier are each connected to common emitters of a second and third pair of differential amplifiers which provide the outputs to the four audio amplifiers. The first differential amplifier has a manual control attached thereto for controlling the relative volume between pairs of channels and the second and third differential amplifiers have manual controls attached thereto for controlling the relative volume between channels in each of the pairs of channels. An enhancement control circuit including first and second amplifier sections coupled together so that the output voltage of one section increases as the output voltage of the other section decreases and vice versa and further constructed so that the decrease of output voltage in either section occurs substantially more rapidly than the increase of output voltage in the other section, is also connected to the differential amplifier in each of the audio amplifiers and controls the amount of audio signal applied thereto.

It is an object of the present invention to provide a new and improved control circuit for use in an audio reproducing system having a plurality of speakers driven by signals from four channels, which signals are derived from a two channel input.

It is a further object of the present invention to provide new and improved adjustable enhancement circuitry for a control circuit in a matrixed four channel audio reproducing system.

It is a further object of the present invention to provide new and improved gain control amplifiers for use in a matrixed four channel audio reproducing system.

It is a further object of the present invention to provide new and improved balance and volume control circuitry for use in a matrixed four channel audio reproducing system.

These and other objects of this invention will become apparent to those skilled in the art upon consideration of the accompanying specification, claims and drawings.

BRIEF DESCRIPTION OF THE DRAWINGS

Referring to the drawings, wherein like characters indicate like parts throughout the figures:

FIG. 1 is a block diagram of a matrixed four channel audio reproducing system;

FIG. 2 is a schematic diagram of a portion of the gain control illustrated in FIG. 1;

FIG. 3 is a graphical representation of the operation of the enhancement circuitry illustrated in FIG. 2.

DESCRIPTION OF THE PREFERRED EMBODIMENT

Figure 4:
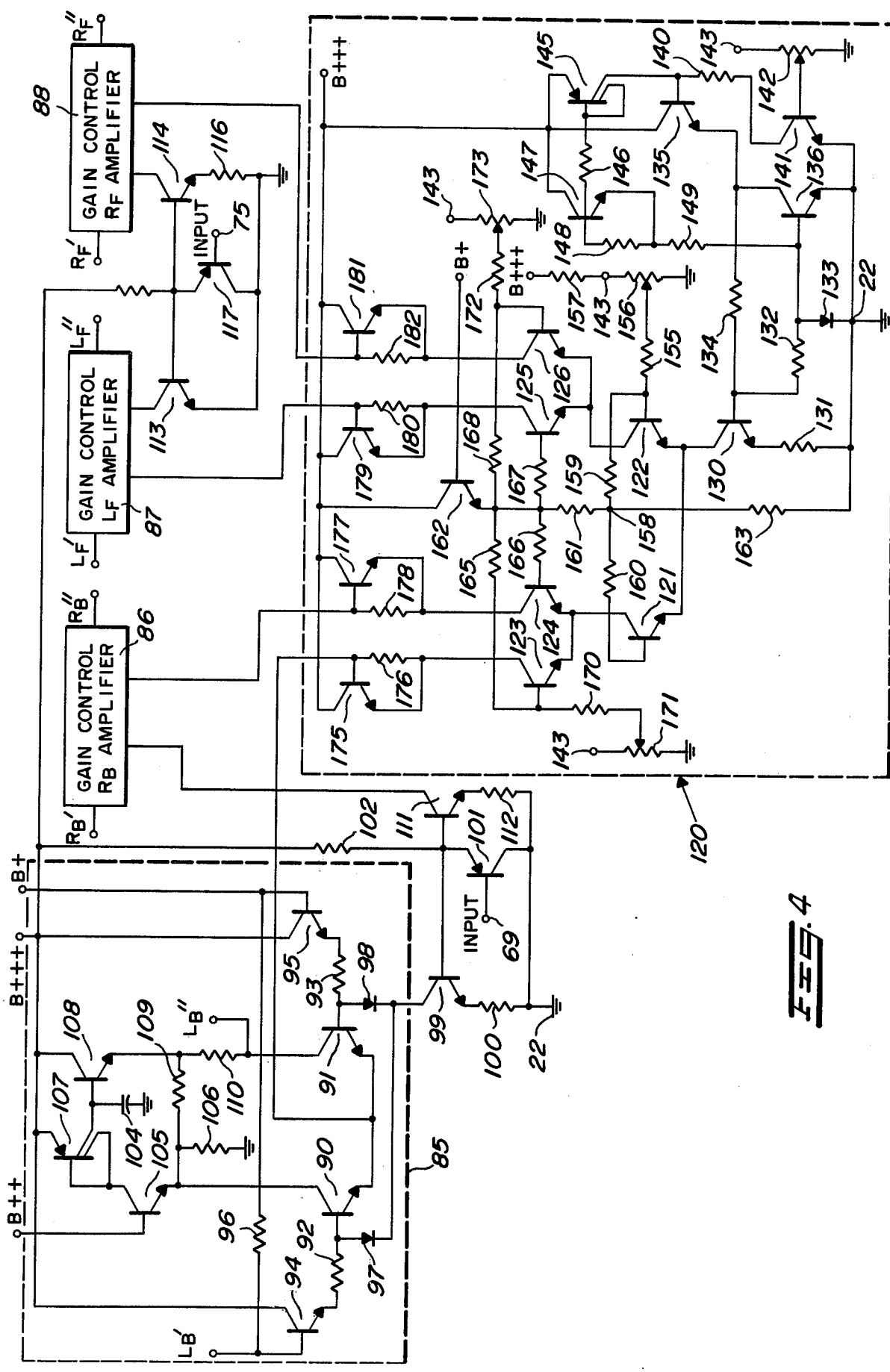
FIG. 4 is a schematic diagram of a portion of the gain control which connects to the portion illustrated in FIG. 2.

Referring specifically to FIG. 1, a pair of signals designated $L_T$ and $R_t$, denoting the total left signal and the total right signal, are obtained from some source, such as a phonograph record or the like and apply to a two-four matrix 10. The matrix 10 derives four signals, designated $L_F'$, $L_B'$, $R_F'$ and $R_B'$ for left front, left back, right front and right back, respectively, from the two input signals which matrixing may be performed in accordance with any of a variety of techniques well known in the art. The matrixing system utilized herein is a system commonly known as the SQ system, which is a trademark of CBS Incorporated. The four signals from the matrix 10 are applied to front/back gain control circuitry designated 11 and logic circuitry 12. The logic circuitry 12 supplies a pair of control signals to the front/back gain control circuitry 11 on a pair of leads 13 and 14. The logic circuit 12 receives the four decoded signals $L_F'$, $R_F'$, $L_B'$ and $R_B'$. The logic circuit normalizes the level of the signals and determines whether in the original audio signals (no cross talk present) the total level of the front signals $L_F$ and $R_F$ have an instantaneous value greater than the back signals $R_B$ and $L_B$ or vice versa. If this information is derived from the modified signals it can be used to modify the ratio of front to back gain in a way to increase the apparent separation which was lost in the four channel to two channel matrix and de-matrix process. By determining whether the front or back signals are dominant the gain of the front and back pairs of amplifiers can be appropriately adjusted. By improving the apparent front to back separation the apparent localization of the sound source can be improved so that the position of the source can be isolated not only with regard to its position between right and left but also between front and back.

The logic circuit derives the appropriate front-back control signals and applies them as currents to the leads 13 and 14. The front/back gain control circuit 11 controls the output of the four channels so as to increase the volume of the dominant pair and decrease the volume of the remaining pair to enhance the apparent separation of speakers driven by the four channels and positioned to the front and back of a listener.

Referring specifically to FIG. 2, the leads 13 and 14 are connected to the bases of a pair of NPN type transistors having common connected emitters. The transistors 20 and 21 form a differential amplifier with the common emitters connected to a reference potential, such as ground 22, through an NPN type transistor 23. A pair of diodes 24 and 25 are coupled in back-to-back relationship (cathodes connected together) between the bases of the transistors 20 and 21 with the junction of the diodes 24 and 25 connected to the base of the transistor 23. The base of the transistor 23 is also connected through a resistor 25 to the collector thereof and through a resistor 26 to the movable arm of a potentiometer 27. One end of the potentiometer 27 is connected to ground 22 and the other end is connected through a resistor 28 to a terminal designated B+++, which is connected to a positive voltage source not shown. The junction of the resistors 27 and 28 is connected to the anode of a pair of series connected diodes 29 and 30 with the cathode of the diode 30 connected to ground 22. The components 26–30 form a manual enhancement control which determines the amount the dominant pair of signals (front or back in this embodiment) is amplified and the remaining pair of signals is reduced.

The collectors of the pair of transistors 20 and 21 provide the output of the differential amplifier and are connected through resistors 35 and 36, respectively, to the bases of a pair of NPN transistors 37 and 38. The common emitters of the transistors 20 and 21 are connected to common connected emitters of two NPN type transistors 39 and 40. The base of the transistor 39 is connected to the emitter of the transistor 37 and the collector of the transistor 39 is connected to the base and one collector of a lateral split collector, PNP type transistor 45. The base of the transistor 40 is connected to the emitter of the transistor 38 and the collector is connected to the base and one collector of a lateral split collector, PNP type transistor 46. The emitter of the transistor 45 is connected to the collector of the transistor 37 and through a pair of series connected resistors 47 and 48 to the base of the transistor 37. The emitter of the transistor 46 is connected to the collector of the transistor 38 and through a pair of series connected resistors 49 and 50 to the base of the transistor 38. The junction of the two resistors 47 and 48 is connected through a resistor 55 to the junction of the two resistors 49 and 50. The emitter of the transistor 45 is connected through a PNP type transistor 56 to a terminal coupled to the B+++ supply. The emitter of the transistor 46 is connected through an NPN type transistor 57 to the B+++ terminal. The bases of the transistors 56 and 57 are connected together and through a resistor 58 to ground 22. The emitters are also connected to the cathode of a diode 59, the anode of which is connected to the B+++ terminal. The transistors 56 and 57 simply form constant current sources for the remainder of the enhancement circuitry. The second collector of the transistor 45 is coupled through a resistor 60 to the base of an NPN type transistor 65, the collector of which is connected directly to the B+++ terminal. The base of the transistor 65 has one side of a storage capacitor 66 connected thereto, the other side of which is connected to ground 22. The emitter of the transistor 65 is connected through two series connected resistors 67 and 68 to ground 22 with the junction of the two resistors providing one output of the enhancement circuit at a terminal 69. The second collector of the transistor 46 is connected through a resistor 70 to the base of a transistor 71, the collector of which is connected to the terminal B+++. One side of a storage capacitor 72 is connected to the base of the transistor 71 and the other side is connected to ground 22. The emitter of the transistor 71 is connected through two series connected resistors 73 and 74 to ground 22 with the junction of the two resistors providing a second output of the enhancement circuit at a terminal 75.

The differential amplifier, including transistors 20, 21 and 23, forms a symmetrical enhancement control circuit, the transistors 37, 39 and 45 form a first amplifier section and the transistors 38, 40 and 46 form a second amplifier section. All of the current for the first and second amplifier sections passes through the constant current source, transistor 23, with the amount of current flowing therein controlled by the enhancement adjustment (26–30). Since the enhancement circuit is symmetrical, the operation thereof will be explained in conjunction with a signal appearing on one input and it should be understood that a signal on the other input will produce similar results in the other portion of the circuit.

With a positive signal applied to the lead 13, current flows through the diode 24, resistor 25 and transistor 23 to ground 22. This current provides a bias voltage for transistor 20 consisting of the voltage across diode 24 and resistor 25. Thus, input signals are amplified or attenuated in the differential amplifier, according to the setting of the potentiometer 27, and appear as collector currents in the transistors 20 and 21. In the quiescent condition no current flows in transistors 20 and 21 and the first and second amplifier sections are passing equal currents, which currents are supplied from the constant current sources (transistors 56 and 57) and pass through transistor 23. The voltage on the emitters of transistors 39 and 40 is approximately equal to the voltage at the base of transistor 23, which is the $\phi$ (the voltage drop across one semiconductor junction). The voltage at the emitters of transistors 45 and 46 will be the sum of the base to emitter voltages of transistors 23, 39 and 37 and transistors 23, 40 and 38, respectively, which is three $\phi$. Since the system is symmetrical and the voltages are equal on the emitters of both the transistors 45 and 46, no current will flow through the resistor 55. With a signal applied to the lead 13 the transistor 20 will conduct and the collector current therein will tend to reduce the potential at the junction of the resistors 35 and 48, which will reduce the conduction in the transistors 37, 39 and 45. Consequently, the potential at the emitter will rise until the current can be supplied by way of resistors 47 and 48. The rise in potential at the emitter of transistor 45 causes a related rise in the potential at the junction of resistors 47, 48 and 55 which causes a current to flow through resistor 55 into the second amplifier section. The current flowing into the second amplifier section is in such a sense as to increase the conduction in transistors 38, 40 and 46, which causes the potential at the emitter of transistor 46 to fall until the current can be supplied through resistor 49. The charges on the storage capacitors 66 and 72, which were three $\phi$ in the quiescent condition, will now change to coincide with the potential on the emitters of the transistors 45 and 46, i.e. the potential on capacitor 66 will increase and the potential on capacitor 72 will decrease. The changes in potential across the capacitors 66 and 72 are applied to the output terminals 69 and 75 by way of the emitter follower circuits (transistors 65 and 71). Thus, a positive signal applied to the lead 13 causes a positive excursion of the output signal at the terminal 69 and a negative excursion of the output signal at the terminal 75.

The negative excursion of the output signals from the enhancement circuit of FIG. 2 is much less than the positive excursion so that the gain reduction in amplifier circuits to be explained presently is greater than the gain increase (an increase in the output voltage of the enhancement circuit produces a decrease in the gain of the channels and vice versa, as will be explained presently). When the signals in the front channels dominate the signals in the back channels, it has been found that the desired amount of separation of the front and back signals can be obtained by increasing the signals in the front channels by 3db and reducing the signals in the back channels by some substantially greater amount, anything in excess of 6db. In the enhancement circuit of FIG. 2, assuming the positive signal on the lead 13 as previously described, the negative voltage excursion of the emitter of transistor 46 is limited by saturation of the transistor 38. Transistor 38 saturates when the potential at its collector falls to approximately 2 $\phi$ (the sum of the base-emitter voltages of transistors 23 and 40) and, since the quiescent potential at the collector is 3 $\phi$ the maximum negative excursion is $\phi$. This can be made to correspond to a gain increase of 3db in the controlled channels by properly selecting the values of resistors 47, 48, 49, 50 and 55. In the present embodiment these resistors are all 15K ohms and the B+++ supply voltage is 21 volts. FIG. 3 illustrates the control voltage output to each channel as a function of collector current in transistors 20 or 21. The negative excursion of the output voltage is illustrated in FIG. 3 by the line designated 80 which decreases from 3 $\phi$ to 2 $\phi$ at the line designated at a current level $\phi$ per 15K ohms and remains at 2 $\phi$ thereafter. A second line designated 81 in the graph of FIG. 3 illustrates the positive excursions of the output voltage and it can be seen that there is no limit on this excursion indicated. In practice it is desirable to place an upper limit on the gain control voltage. This limit is provided by resistors 35 and 36. The values of these resistors are chosen to provide an upper limit on the control voltage. The limiting action is produced by collector voltage drop on transistors 20 or 21 which places an upper limit on the current in transistors 20 or 21 since they tend to saturate when the current through 35 or 36 causes the collector to emitter voltage to approach zero. Further, because of the choice of resistive values the positive excursion is at 6 $\phi$ when the negative excursion is at 2 $\phi$, which provides a gain reduction in the following amplifier circuits of approximately 6db.

Referring to the gain control circuitry 11 in FIG. 1, the gain of the signals in the dominant pair of channels can be increased to a maximum of 3db while the gain of the remaining pair of channels is simultaneously decreased a much larger amount (as explained above) and, in addition, the increase in gain should occur relatively quickly while the decrease may be made in a relatively long period of time. The enhancement circuitry illustrated in FIG. 2 accomplishes this in the following manner. With the circuit in the quiescent state, both capacitors 66 and 72 are charged to a value of 3 $\phi$, which is the emitter potentials of transistors 45 and 46. With a positive current suddenly appearing on lead 13, the potential on the emitter of transistor 45 rises so that the collector coupled to capacitor 66 is no longer in a saturated condition. A portion of the emitter current is therefore supplied to capacitor 66 to charge it towards the new emitter potential. The charging rate is determined by the emitter current of transistor 45, the value of capacitor 66 and the ratio of the collector areas of the transistor 45. Thus, the time constant can be made relatively long as is required for a decreasing gain condition. With the rise of the emitter potential of transistor 45, the emitter and base potentials of the transistor 46 decrease. Thus, capacitor 72 is charged to a potential higher than the emitter potential of transistor 46. The result is that the free collector coupled to the capacitor 72 becomes an emitter (so that transistor 46 becomes a double emitter PNP transistor rather than a double collector transistor). The available base current for the transistor 46 is very high, substantially all of the current supplied by transistor 57 multiplied by the current gain of transistor 40, so that the current flow in the free collector of transistor 46 can be very high causing a very rapid discharge of capacitor 72. The resistor 70 is used to define this discharge time and, in the present embodiment is a 1K ohm resistor. Hence, negative voltage excursions at the output, corresponding to increasing gains in the following amplifying circuits, can occur relatively quickly.

Referring specifically to FIG. 4, four gain control amplifiers 85-88 are illustrated with the amplifier 85 receiving the $L_B'$ signal, amplifier 86 receiving the $R_B'$ signal, amplifier 87 receiving the $L_F'$ signal and amplifier 88 receiving the $R_F'$ signal. All four of the amplifiers are identical and, consequently, only the amplifier 85 is illustrated by a complete schematic diagram. A pair of NPN type common emitter connected transistors 90 and 91 form a differential amplifier with the bases connected through resistors 92 and 93, respectively, to the emitters of NPN type transistors 94 and 95. The base of the transistor 94 is connected to a terminal designated $L_B'$ and receives the signal from the matrix 10. The base of the transistor 95 is connected to a positive terminal B+ (having a potential somewhat lower than the potential at the terminal B+++) and through a resistor 96 to the $L_B'$ terminal. A pair of diodes 97 and 98 are connected in back-to-back relationship (the cathodes are connected together) between the bases of the transistors 90 and 91, with the junction connected to the collector of an NPN type transistor 99. The emitter of the transistor 99 is connected through a resistor 100 to ground 22. The base of the transistor 99 is connected to the emitter of a PNP type transistor 101 and through a resistor 102 to the B+++ terminal. The collector of the transistor 101 is connected to ground 22 and the base is connected to the terminal 69 (see FIG. 2) which is one output of the enhancement circuitry.

In the operation of the differential amplifier portion of the gain control amplifier 85, a positive voltage on the terminal 69 causes the transistor 101 to conduct less, which increases the voltage on the base of the transistor 99 and decreases the collector voltage while increasing the conduction therethrough. Reducing the collector voltage of the transistor 99 causes the diodes 97 and 98 to conduct more of the audio signals which are applied to the bases of the transistors 90 and 91 from the terminal $L_B'$. A decrease or negative excursion of the signal on the terminal 69 causes the opposite effect.

The collector of the transistor 90 is connected to the emitter of an NPN type transistor 105 and through a resistor 106 to ground 22. The base of the transistor 105 is connected to a positive voltage terminal having a voltage B++ applied thereto, which voltage is slightly less than the voltage B+++. The collector of the transistor 105 is connected to the base of a PNP type lateral split collector transistor 107 and to one collector thereof. The emitter of the transistor 107 is connected directly to the terminal B+++ and the other collector is connected to the base of an NPN type transistor 108 and through a capacitor 104 to ground. The collector of the transistor 108 is connected directly to the B+++ terminal and the emitter is connected through a resistor 109 to the emitter of the transistor 105 and through a resistor 110 to the collector of the transistor 91 in the differential amplifier circuit. The transistors 105, 107 and 108 and their associated components form a differential to single ended converter and the output thereof is obtained at a terminal designated $L_B''$ connected directly to the collector of the transistor 91.

The operation of the differential to single ended converter in the gain control amplifier 85 is as follows. The output of the differential amplifier on the collectors of the transistors 90 and 91 is the difference between the collector currents. In the quiescent state the currents supplied by the collectors of 90 and 91 are equal and the output voltage at the terminal $L_B''$ is equal to the voltage B++ applied to the base of the transistor 105 less the base-emitter voltage of the transistor 105. This is true because the quiescent voltage drops across the resistors 109 and 110, which resistors 109 and 110 are equal in size, will be equal and in phase with respect to the emitter of transistor 108. Further, this is independent of the magnitude of the quiescent currents flowing in the differential amplifier. The transistors 105, 107 and 108 form an amplifier whose transfer impedance is very closely defined by the resistor 109, which forms a negative feedback loop therearound. The collector current from the transistor 90, $I_{90}$, is applied to the input of the amplifier and appears at the emitter of the transistor 108 as a signal $I_{90}R$, where R is the value of the resistor 109. The collector current from the transistor 91, $I_{91}$, is applied through the resistor 110, which also has the value R, to the emitter of the transistor 108. Because of the negative feedback, the junction of the resistors 109 and 110 is a very low impedance and no significant signal will be developed at the emitter of the transistor 108 by the collector current of the transistor 91. Thus, the output signal at the terminal $L_B''$ consists of the algebraic sum of the two currents developed at the terminal of the equal resistors 109 and 110 which is $(I_{90} - I_{91})R$. The distortion of this converter is very low since the amplifier, including transistors 105, 107 and 108, has considerable negative feedback and conducts no signal currents unless the output terminal $L_B''$ is loaded. This is because the signal currents flowing in transistors 90 and 91 are equal and in opposed phase so that no net signal current may flow in the transistor 108 emitter circuit apart from that flowing in the output lead to terminal $L_B''$. Further, the output of the converter is essentially a voltage signal and the transistor 108 can linearly handle relatively large currents, compared to the lateral dual collector transistor 107.

The base of an NPN type transistor 111 is connected to the emitter of the transistor 101 and the emitter thereof is connected to ground 22 through a resistor 112. The collector of the transistor 111 is connected to the junction of a pair of back-to-back connected diodes (not shown) in the gain control amplifier 86 and operates therewith in the same manner as transistor 99 and the gain control amplifier 85. A pair of NPN type transistors 113 and 114 each have an emitter connected to ground through resistors 115 and 116, respectively. The bases of transistors 113 and 114 are connected together and to the emitter of a PNP type transistor 117, which has a collector connected to ground 22. The collectors of the transistors 113 and 114 are connected to the junctions of pairs of back-to-back connected diodes (not shown) in the gain control amplifiers 87 and 88, respectively. The base of the transistor 117 is connected to the terminal 75, which is the second output of the enhancement circuitry (FIG. 2). The transistors 113, 114 and 117 operate the same as the operation described for transistors 99, 101 and 111 but, since the signals on terminals 69 and 75 operate in opposition, the circuits will be operating in opposition.

To complete the differential amplifier circuit in the gain control amplifier 85 (and in the gain control amplifiers 86, 87 and 88), the common emitters of the transistors 90 and 91 must be connected through a constant current source to a reference potential, which in this application is ground 22. The constant current source for each of the gain control amplifiers 85–88 is embodied in balance and volume control circuitry generally designated 120. The circuitry 120 includes a first pair of common emitter connected NPN type transistors 121 and 122, a second pair of common emitter connected NPN type transistors 123 and 124 and a third type of common emitter connected NPN type transistors 125 and 126. The emitters of the transistors 121 and 122 are connected to the collector of an NPN type transistor 130, the emitter of which is connected to ground 22 through a resistor 131. The emitters of the transistors 123 and 124 are connected to the collector of the transistor 121 and the emitters of the transistors 125 and 126 are connected to the collector of the transistor 122. The base of the transistor 130 is connected through a resistor 132 to the anode of a diode 133, the cathode of which is connected to ground 22, and through a resistor 134 to the emitter of an NPN type transistor 135 and the collector of an NPN type transistor 136. The base of the transistor 136 is connected to the junction of the resistor 132 and the diode 133 and the emitter is connected to ground 22. The base of the transistor 135 is connected through a resistor 140 to the emitter of a PNP type transistor 141, the collector of which is connected to ground 22 and the base of which is connected to the movable contact of a potentiometer 142 connected between a terminal 143 and ground. The base of the transistor 135 is also connected to one collector of a lateral dual collector PNP type transistor 145. The collector of the transistor 135 is connected to the emitter of the transistor 145 and to the B+++ terminal. The second collector of the transistor 145 is connected to the base thereof and through a resistor 146 to the base of an NPN type transistor 147. The collector of the transistor 147 is connected to the B+++ terminal and the emitter is connected through a resistor 148 to the base thereof and through a resistor 149 to the base of the transistor 136. The potentiometer 142 controls the amount of current flowing in the transistor 130, relatively independent of variations in temperature and power supply voltages.

The base of the transistor 122 is connected through a resistor 155 to the movable contact of a potentiometer 156, which is connected between the terminal 143 and ground. The terminal 143 is connected to the terminal B+++ by a resistor 157. The base of the transistor 122 is also connected to a junction point 158 by a resistor 159. The base of the transistor 121 is connected to the junction point 158 by a resistor 160. The junction point 158 is connected through a resistor 161 to the emitter of an NPN type transistor 162 and through a resistor 163 to ground. The base of the transistor 123 is connected through a resistor 165 to the emitter of the transistor 162 and the base of the transistor 124 is connected to the emitter of the transistor 162 through a resistor 166. The base of the transistor 125 is connected through a resistor 167 to the emitter of the transistor 162 and the base of the transistor 126 is connected through a resistor 168 to the emitter of the transistor 162. The base of the transistor 123 is also connected through a resistor 170 to the movable contact of a potentiometer 171, which is connected between the terminal 143 and ground 22. The base of the transistor 126 is connected through a resistor 172 to the movable contact of a potentiometer 173, which is connected between the terminal 143 and ground 22. The base of the transistor 162 is connected to the B+ terminal and the collector is connected to the B+++ terminal. The collector of the transistor 123 is connected to the emitter of a current shunt, NPN type transistor 175 and through a resistor 176 to the base thereof. The collector of the transistor 175 is connected to the B+++ terminal. The base of the transistor 175 provides one output from the balance and volume control circuit 120 and is connected to the common emitters of the transistors 90 and 91 in the gain control amplifier 85. The collector of the transistor 124 is connected to the emitter of a current shunt, NPN type transistor 177 and, through a resistor 178 to the base thereof. The collector of the transistor 177 is connected to the B+++ terminal. The base of the transistor 177 provides a second output of the balance and volume control circuit 120 and is connected to the common emitters of a differential amplifier (not shown in detail) in the gain control amplifier 86. The collector of the transistor 125 is connected to the emitter of a current shunt, NPN type transistor 179 and through a resistor 180 to the base thereof. The collector of the transistor 179 is connected to the B+++ terminal. The base of the transistor 179 provides an output of the balance and volume control circuit 120 and is connected to the common emitters of a differential amplifier (not shown in detail) in the gain control amplifier 87. The collector of the transistor 126 is connected to the emitter of a current shunt, NPN type transistor 181 and through a resistor 182 to the base thereof. The collector of the transistor 181 is connected to the terminal B+++. The base of the transistor 181 provides an output of the balance and volume control circuit 120 and is connected to the common emitters of a differential amplifier (not shown in detail) in the gain control amplifier 88.

In the operation of the balance and volume control circuit 120, all of the operating current for the four amplifiers 85–88 is carried by the transistor 130. The amount of this current flowing in the transistor 130 is determined by the setting of the potentiometer 142 and the remaining circuitry connected to the base of the transistor 130, which determines the total volume of the system. The current flowing through the transistor 130 is divided into two paths, including transistor 121 and transistor 122 respectively, and the setting of the potentiometer 156 determines the relative amount of the total current flowing in each of the transistors 121 and 122. In the present embodiment the transistor 121 carries all of the current for the left back and right back amplifiers 85 and 86 and the transistor 122 carries all of the current for the left front and right front amplifiers 87 and 88. The current passing through the transistor 121 is divided into two paths, including transistors 123 and 124 respectively, and the setting of the potentiometer 171 determines the relative amount of current flowing in each of the transistors 123 and 124. The current flowing in the transistor 122 is divided into two paths, including transistors 125 and 126 respectively, and the setting of the potentiometer 173 determines the relative amount of current flowing in each of the transistors 125 and 126. Thus, the potentiometer 142 is a master volume control, the potentiometer 156 is a front-to-back balance control, the potentiometer 171 is a left back to right back balance control and the potentiometer 173 is a left front to right front balance control. The balance controls 156, 171 and 173 control the absolute balance between the four channels regardless of the setting of the volume control 142. In the event that the current flowing in one of the channels is too high because of extreme adjustments of the balance controls, the current shunt transistors 175, 177, 179 or 181 will be biased into conduction and will shunt the excess current to protect the remaining circuitry in the channel.

Thus, an improved control circuit for an audio reproducing system having a plurality of speakers driven by signals from four channels, which signals are derived from a two channel input, is disclosed. The control circuit includes improved enhancement circuitry, improved amplifiers in each channel and improved balance and control circuitry which provides the overall system with many advantages not available in prior art circuitry. Throughout the description of the preferred embodiment specific sizes of components and types of semiconductor devices have been disclosed, and it should be understood that these specific components are disclosed for exemplary purposes only and one skilled in the art might incorporate different types of semiconductor devices or semiconductor devices having a different type of conductivity. Further, this entire circuit is designed for incorporating into an IC chip but is should be understood that the circuit could be provided in discrete form also. While I have shown and described a specific embodiment of this invention, further modifications and improvements will occur to those skilled in the art. I desire it to be understood, therefore, that this invention is not limited to the particular form shown and I intend in the appended claims to cover all modifications which do not depart from the spirit and scope of this invention.

I claim:

1. In an audio reproducing system having a plurality of speakers driven by signals from four channels, which signals are derived from a two channel input, a control circuit comprising:
   a. logic circuitry for separating the four channels into two pairs of channels and determining which signals in the two pairs of channels are dominant and providing output signals indicative thereof;
   b. adjustable enhancement circuitry connected to receive the output signals from said logic circuitry and providing a pair of output signals for substantially increasing the output of the speakers driven by the dominant channels and reducing the output of the remaining speakers, said enhancement circuitry including first and second amplifier sections connected together so that the output voltage of one section increases as the output voltages of the other section decreases and vice versa, the output voltage of said sections being controlled by the output signals from said logic circuitry, said amplifier sections being constructed so that the output voltage of either section can only decrease to a minimum predetermined value, and said amplifier sections further being constructed so that the decrease of output voltage in either section occurs substantially more rapidly than the increase of output voltage in the other section;
   c. four gain control amplifiers each connected to a different channel and connected to drive a speaker associated with that channel, said gain control amplifiers further being connected in pairs and each pair being connected to receive one of the output signals from said adjustable enhancement circuitry for substantially increasing the drive provided by one pair of amplifiers while reducing the drive provided by the remaining pair of amplifiers in accordance with the output signals of said enhancement circuitry; and
   d. balance and volume control circuitry connected to said gain control amplifiers for controlling the drive to each of said amplifiers relative to each of the other amplifiers.

2. In an audio reproducing system, a control circuit as claimed in claim 1 wherein said enhancement circuitry includes an enhancement control circuit connected to variably control said amplifier sections and including a pair of transistors connected as a differential amplifier with common emitters and a third transistor coupling the common emitters to a reference potential, means attached to a control electrode of said third transistor for controlling the amount of enhancement, a control electrode of each of said pair of transistors connected to receive the output signals from said logic circuitry, and a unidirectional current conducting device coupled between each control electrode of said pair of transistors and the control electrode of said third transistor for controlling the current flowing in said pair of transistors in accordance with current flowing in said unidirectional current conducting devices.

3. In an audio reproducing system, a control circuit as claimed in claim 2 wherein said third transistor of the enhancement control circuit has variable means coupled to said control electrode thereof for varying the amount of enhancement.

4. In an audio reproducing system, a control circuit as claimed in claim 3 wherein said enhancement circuitry further includes a split collector transistor of a first conductivity type having two collectors, an emitter and a control electrode, first and second transistors of a second conductivity type each having first, second and control electrodes, and a storage capacitor coupled between a reference potential and one collector of said split collector transistor, said one collector providing the amplifier section output, the other collector being connected to the control electrode of said split collector transistor and to the first electrode of said first transistor, the second electrode of said first transistor being coupled to the common emitters of said pair of transistors, the control electrode of said first transistor being connected to the second electrode of said second transistor, the first electrode of said second transistor being connected to the emitter of said split collector transistor and coupled to a voltage source, the control electrode of said second transistor being connected to a voltage divider circuit coupled between the first electrode of said second transistor and the output of said pair of transistors.

5. In an audio reproducing system, a control circuit as claimed in claim 4 wherein said split collector transistor is a PNP conductivity type and the first and second transistors are each of an NPN conductivity type with the first electrode thereof being a collector and the second electrode thereof being an emitter.

6. In an audio reproducing system having a plurality of speakers driven by signals from four channels, which signals are derived from a two channel input, a control circuit comprising:
   a. logic circuitry for separating the four channels into two pairs of channels and determining which signals in the two pairs of channels are dominant and providing output signals indicative thereof;
   b. adjustable enhancement circuitry connected to receive the output signals from said logic circuitry and to provide a pair of output signals for substantially increasing the output of the speakers driven by the dominant channels and reducing the output of the remaining speakers;

c. four gain control amplifiers each connected to a different channel and connected to drive a speaker associated with that channel, said gain control amplifiers further being connected in pairs and each pair being connected to receive one of the output signals from said enhancement circuit for substantially increasing the drive provided by one pair of amplifiers while reducing the drive provided by the remaining pair of amplifiers in accordance with the output signals of said enhancement circuitry, each of said gain control amplifiers including a differential amplifier having an input coupled to receive the signal from one of the channels and a pair of outputs coupled to differential to single ended converter, one of the outputs of said enhancement circuit being coupled to said differential amplifier for controlling the amount of signal current applied thereto from said one channel; and d. balance and volume control circuitry connected to said amplifiers for controlling the amount of current flowing in each of said amplifiers relative to each of the other amplifiers.

7. In an audio reproducing system, a control circuit as claimed in claim 6 wherein the differential amplifier includes a pair of common emitter connected transistors, the collectors of which are the outputs, said emitters being coupled to the balance and volume control circuitry, and a pair of diodes connected in a back-to-back relationship between the control electrodes of said common emitter connected transistors with the junction between said pair of diodes being coupled to a reference potential through a pair of transistors one of which has a control electrode coupled to receive an output signal from said adjustable enhancement circuitry to control the potential at the junction of said pair of diodes.

8. In an audio reproducing system, a control circuit as claimed in claim 6 wherein the converter includes first and second transistors of a first conductivity type and a third transistor of a second conductivity type, each of said transistors having first, second and control electrodes, the second electrode of said first transistor being coupled to one of the outputs of the differential amplifier and the second electrode of said second transistor being resistively coupled to the other output of the differential amplifier and to the second electrode of said first transistor, the first electrode of said first transistor being coupled to the control electrode of said third transistor, the first electrode of said second transistor and the second electrode of said third transistor being coupled to a source of voltage, and the control electrode of said first transistor being coupled to a second source of voltage.

9. In an audio reproducing system, a control circuit as claimed in claim 8 wherein the third transistor is a lateral split collector type and the second collector is connected to the control electrode thereof.

10. In an audio reproducing system having a plurality of speakers driven by signals from four channels, which signals are derived from a two channel input, a control circuit comprising:

a. logic circuitry for separating the four channels into two pairs of channels and determining which signals in the two pairs of channels are dominant and providing output signals indicative thereof;

b. enhancement circuitry connected to receive the output signals from said logic circuitry and to provide a pair of output signals for substantially increasing the output of the speakers driven by the dominant channels and reducing the output of the remaining speakers;

c. four gain control amplifiers each connected to a different channel and connected to drive a speaker associated with that channel, said gain control amplifiers further being connected in pairs and each pair being connected to receive one of the output signals from said adjustable enhancement circuitry for substantially increasing the drive provided by one pair of amplifiers while reducing the drive provided by the remaining pair of amplifiers in accordance with the output signals from said adjustable enhancement circuitry; and d. balance and volume control circuitry connected to said amplifiers for controlling the amount of current flowing in each of said amplifiers relative to each of the other amplifiers, said balance and volume control circuitry including a balanced differential amplifier circuit conducting the control current for all four of said gain control amplifiers in one leg, said differential amplifier circuit including four separate legs coupled to said one leg and each of said four separate legs conducting the current for a separate one of said gain control amplifiers, and controls coupled to said one leg for controlling the total volume and to said four separate legs for controlling the balance or relative volume between channels.

11. In an audio reproducing system, a control circuit as claimed in claim 10 having means for providing a reference potential and wherein the one leg includes a first transistor having a first electrode coupled to said means for providing reference potential, a second electrode coupled to the emitters of a first pair of common emitter connected transistors, and a control electrode coupled to a total volume control for controlling the amount of current flowing through said first transistor.

12. In an audio reproducing system, a control circuit as claimed in claim 11 wherein one transistor of the first pair of common emitter connected transistors has the emitters of a second pair of common emitter connected transistors coupled to the collector thereof and the other transistor of the first pair has the emitters of a third pair of common emitter connected transistors coupled to the collector thereof.

13. In an audio reproducing system, a control circuit as claimed in claim 11 wherein the control electrodes of the transistors in the first pair are coupled to a first control for unbalancing the currents flowing in each of the transistors in the first pair to control the relative volume between the two pairs of channels.

14. In an audio reproducing system, a control circuit as claimed in claim 12 wherein the control electrodes of the transistors in the second pair are coupled to a second control for unbalancing the currents flowing in each of the transistors in the second pair to control the relative volume between the two channels in one of the pairs of channels and the control electrodes of the transistors in the third pair are coupled to a third control for unbalancing the currents flowing in each of the transistors in the third pair to control the relative volume between the two channels in the other of the pairs of channels.

* * * * *